(12) United States Patent
Daniell

(10) Patent No.: US 7,028,060 B2
(45) Date of Patent: Apr. 11, 2006

(54) METHOD AND APPARATUS FOR JOINTLY OPTIMIZING LINEAR SIGNAL PROCESSING FILTERS WITH SUBBAND FILTERS

(75) Inventor: Cindy Daniell, Pasadena, CA (US)

(73) Assignee: HRL Laboratories LLC, Malibu, CA (US)

( * ) Notice: Subject to any disclaimer, the term of this patent is extended or adjusted under 35 U.S.C. 154(b) by 593 days.

(21) Appl. No.: 10/141,507

(22) Filed: May 7, 2002

(65) Prior Publication Data

US 2003/0037082 A1    Feb. 20, 2003

Related U.S. Application Data

(60) Provisional application No. 60/289,608, filed on May 7, 2001, provisional application No. 60/289,349, filed on May 7, 2001, provisional application No. 60/289,408, filed on May 7, 2001.

(51) Int. Cl.
*G06F 17/10* (2006.01)
(52) U.S. Cl. .................................. 708/300
(58) Field of Classification Search ............ 708/300
See application file for complete search history.

(56) References Cited

U.S. PATENT DOCUMENTS 5,890,102 A * 3/1999 Kossentini et al. ......... 702/181

FOREIGN PATENT DOCUMENTS

WO        0109760        2/2001

OTHER PUBLICATIONS

Yang et al "Optimal Subband Filter Banks for Multiple Description Coding" IEEETrans. On Information Theory, vol. 46, No. 7, Nov. 2000, Pp. 2477-2490.*
Wah B., W., et al., "Discrete Lagrangian methods for optimizing the design of multiplierless QMF banks," IEEE Transactions on Circuits and Systems II: Analog and Digital Signal Processing, Sep. 1999, vol. 46, No. 9, pp. 1179-1191, XP002210914.
Wah B., W., et al., "QMF filter bank design by a new global optimization method," Acoustics, Speech, and Signal Processing, 1997. ICASSP-97, IEEE Int. Conference in Munich, Germany Apr. 21-24, 1997, Los Alamos, CA, USA, IEEE Comput. Soc. pp. 2081-2084, XP010226345.

* cited by examiner

*Primary Examiner*—Tan V. Mai
(74) *Attorney, Agent, or Firm*—Tope-McKay & Associates

(57) ABSTRACT

A method, apparatus, and a computer program product for generating a set of jointly optimized linear signal processing filters and subband filters for processing digital data on a computer system are presented. In general, the invention performs the operations of determining a design scheme for at least one linear signal processing filter; determining a design scheme for at least one subband filter; and relating the design schemes for the at least one linear signal processing filter and the at least one subband filter in order to determine a relationship therebetween. The relationship provides criteria for optimization (e.g. maximizing data compression while minimizing processing requirements). Next, the design schemes are jointly adjusted using the relationship to optimize the criteria for optimization and generates an optimized linear signal processing filter/subband filter set to provide improved data processing performance.

43 Claims, 17 Drawing Sheets

| | Input Test Data | correlation Design Data | QMF | correlation Design |
|---|---|---|---|---|
| System for Uncompressed Data | original | original | not applicable | standard |
| SPSC - Baseline QMF/correlation | subband transformed | reconstructed | baseline | standard |
| SPSC - First Order Jointly Optimized QMF/ correlation | subband transformed | reconstructed | jointly optimized w/ correlation | jointly optimized w/ QMF |
| SPSC - Second Order Jointly Optimized QMF/ correlation | subband transformed | reconstructed | jointly optimized w/ correlation | jointly optimized w/ QMF |

FIG. 6

|  | Recognition Metrics | | | Reconstruction Metrics | |
| --- | --- | --- | --- | --- | --- |
|  | Pc | Pe | Pr | PSNR | MSE |
| System for Uncompressed Data | 96.2% | 3.8% | 0% | not applicable | not applicable |
| SPSC - Baseline QMF/correlation | 96.2% | 3.8% | 0% | 105 db | $10^{-6}$ |
| SPSC - First Order Jointly Optimized QMF/correlation | 100% | 0% | 0% | 43.4 db | 2.97 |
| SPSC - Second Order Jointly Optimized QMF/correlation | 100% | 0% | 0% | 46.5 db | 1.46 |

FIG. 7

(b)
Reconstructed Image (a)
Original Image

| Compression Rate | | Recognition Metrics | | | Reconstruction Metrics | |
| --- | --- | --- | --- | --- | --- | --- |
| Target Rate | Actual Rate | Pc | Pe | Pr | PSNR | MSE |
| 8 bpp | 7.96 bpp | 100% | 0% | 0% | 43.4 db | 2.97 |
| 6 bpp | 5.94 bpp | 100% | 0% | 0% | 43.4 db | 2.97 |
| 4 bpp | 3.98 bpp | 100% | 0% | 0% | 43.3 db | 2.97 |
| 2 bpp | 1.87 bpp | 100% | 0% | 0% | 43.3 db | 2.97 |
| 1 bpp | 1.33 bpp | 98.7% | 1.3% | 0% | 43.3 db | 2.97 |
| 0.5 bpp | 0.28 bpp | 72.2% | 27.8% | 0% | 30.8 db | 54.3 |
| 0.25 bpp | 0.07 bpp | 51.9% | 48.1% | 0% | 30.4 db | 59.9 |

FIG. 14

| Actual Rate | Subbands Dropped |
|---|---|
| 1.01 bpp | on level 1: HL, LH, HH |
| 0.28 bpp | on level 1: HL, LH, HH<br>on level 2: HH<br>on level 3: HH |
| 0.07 bpp | on level 1: HL, LH, HH<br>on level 2: HL, LH, HH<br>on level 3: HH |

FIG. 15

METHOD AND APPARATUS FOR JOINTLY OPTIMIZING LINEAR SIGNAL PROCESSING FILTERS WITH SUBBAND FILTERS

PRIORITY CLAIM

This application claims the benefit of priority to the following provisional applications; 60/289,608, titled Joint Filter Optimization for Signal Processing Subband Coder Architecture filed with the United States Patent and Trademark Office on May 7, 2001; and 60/289,349, titled Signal Processing Subband Code Architecture, filed with the United States Patent and Trademark Office on May 7, 2001; and 60/289,408, titled Object Recognition in Compressed Imagery, filed with the United States Patent and Trademark Office on May 7, 2001.

BACKGROUND OF THE INVENTION (1) Technical Field

The present invention relates to techniques for signal processing. More specifically, the present invention relates to the joint optimization of signal filters in order to provide improved processing capability with respect to desired characteristics of the filters.

(2) Discussion

Data filtering or mapping techniques have been used for many years in the field of signal processing. Filters are used in a wide variety of applications, such as image processing, pattern recognition, noise reduction, data manipulation, data compression, and data encryption. Many of these filters can be used in conjunction with one another, e.g., for performing multiple functions such as pattern recognition and encryption at the same time.

Currently, however, there is no technique for jointly optimizing a linear signal processing filter and a subband filter with the intent of operating the linear signal processing filter directly on the multiresolution data of the subband decomposition.

SUMMARY OF THE INVENTION

The present invention provides method, apparatus, and computer program product embodiments for generating a set of jointly optimized linear signal processing filters and subband filters for processing digital data on a computer system. The general operations of the invention include determining a design scheme for at least one linear signal processing filter, with the design scheme dependent upon at least one performance characteristic; determining a design scheme for at least one subband filter, with the design scheme dependent upon at least one performance characteristic; and relating the design schemes for the at least one linear signal processing filter and the at least one subband filter in order to determine a relationship therebetween. Next the design schemes for the at least one linear signal processing filter and the at least one subband filter are jointly adjusted using the relationship therebetween to optimize at least one desirable performance characteristic. Thus, a set of linear signal processing filters and subband filters are optimized together in order to provide better data processing performance with regard to the at least one desirable performance characteristic than would be available without optimization.

In another embodiment, the at least one linear signal processing filter is selected from a group consisting of correlation filters, noise-reduction filters, and data manipulation filters; and wherein the at least one subband filter is selected from a group consisting of compression filters and encryption filters.

In yet another embodiment, one linear signal processing filter and one subband filter are optimized, and the linear signal processing filter is a correlation filter and the subband filter is a compression filter, and the correlation filter and the compression filter are optimized for object recognition for image data in image datasets.

In a still further embodiment, the compression filter is a quadrature mirror filter.

In a further aspect of the present invention, the design scheme used for the correlation filter is a Lagrangian objective function for optimizing the correlation process by maximizing an in-class response and minimizing an out-of-class response, and where the design scheme used for the quadrature mirror filter is an iterative optimization procedure for optimizing a set of error terms comprising an amplitude distortion error term, an aliasing distortion error term, and a DC error term; whereby the ability of the correlation filter to perform recognition is maximized and the ability of the quadrature mirror filter to perform data compression is maximized without sacrificing the recognition ability of the correlation filter, thus optimizing quantization.

In a still further aspect, the present invention performs a further operation of optimizing the data compression of the quadrature mirror filter by employing an encoding optimizer.

Each of the operations of the apparatus discussed above typically corresponds to a software module for performing the function on a computer or a piece of dedicated hardware with instructions "hard-coded" therein. In other embodiments, the means or modules may be incorporated onto a computer readable medium to provide a computer program product. Also, the means discussed above also correspond to steps in a method. Finally, the present invention also comprises a set of at least one linear signal processing filter and at least one subband filter produced by the method, apparatus, or computer program product of the present invention.

BRIEF DESCRIPTION OF THE DRAWINGS

The objects, features and advantages of the present invention will be apparent from the following detailed descriptions of the various embodiments of the invention in conjunction with reference to the following drawings.

FIG. 6 is a table summarizing the system specifications for the signal processing subband coder used for the example embodiments discussed herein;

FIG. 7 is a table summarizing the results of a performance evaluation of jointly optimized filters developed by the present invention, using recognition and reconstruction metrics as the basis of the evaluation;

FIG. 14 is a table depicting the evaluation results of the signal processing subband coder developed by means of the present invention as a function of bit rate;

FIG. 15 is a table depicting subbands dropped by the subband filter at low bit rates;

DETAILED DESCRIPTION OF PREFERRED EMBODIMENTS

Figure 1:
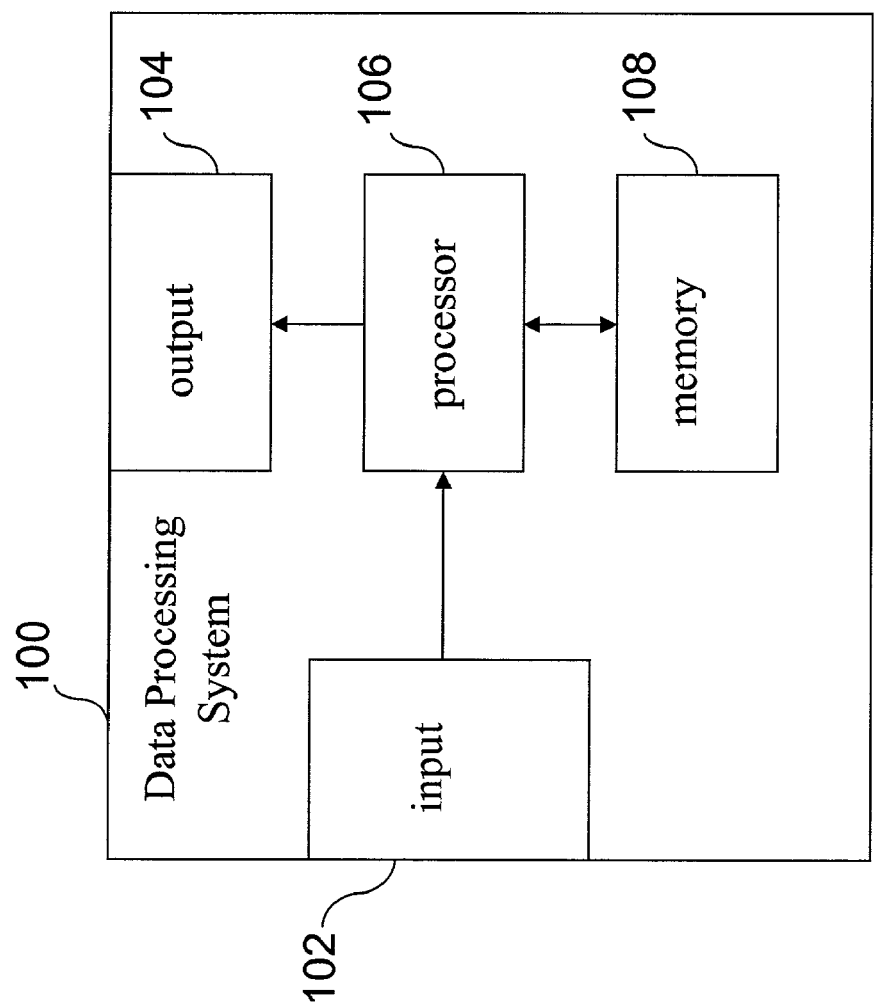
FIG. 1 is a block diagram depicting the components of a computer system used in the present invention.

The present invention relates to techniques for signal processing. More specifically, the present invention relates to the joint optimization of signal filters in order to provide improved processing capability with respect to desired characteristics of the filters. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles defined herein, may be applied to a wide range of embodiments. Thus, the present invention is not intended to be limited to the embodiments presented, but is to be accorded the widest scope consistent with the principles and novel features disclosed herein. Furthermore, it should be noted that, unless explicitly stated otherwise, the figures included herein are illustrated diagrammatically and without any specific scale, as they are provided as qualitative illustrations of the concept of the present invention.

In order to provide a working frame of reference, first a glossary of terms used in the description and claims is given as a central resource for the reader. Next, a discussion of various physical embodiments of the present invention is provided.

Finally, a discussion is provided to give an understanding of the specific details.

(1) Glossary

Before describing the specific details of the present invention, a centralized location is provided in which various terms used herein and in the claims are defined. The glossary provided is intended to provide the reader with a general understanding of the intended meaning of the terms, but is not intended to convey the entire scope of each term. Rather, the glossary is intended to supplement the rest of the specification in more accurately explaining the terms used.

Design Scheme—This term refers to a construct for a linear signal processing filter or a subband filter, and is often the operation of the filter(s) as defined by an equation or a set of equations. The design scheme of a filter is cast such that it may be related to the design schemes of the other filters to be optimized. Further, the design schemes of the filters to be optimized are cast in terms of a performance characteristic with respect to which they are to be optimized.

Means—The term "means" as used with respect to this invention generally indicates a set of operations to be performed on, or in relation to, a computer.

Non-limiting examples of "means" include computer program code (source or object code) and "hard-coded" electronics. The "means" may be stored in the memory of a computer or on a computer readable medium, whether in the computer or in a location remote from the computer.

Performance Characteristic—This term refers to the aspect(s) of a filter for which optimization is desired. For example, in the case of a correlation filter, the performance characteristic is its ability to recognize patterns; in the case of a noise suppression filter, the performance characteristic is its ability to reduce signal noise; in the case of a compression filter, the performance characteristic is its ability to compress and decompress data. During the optimization process, the design schemes of the filters to be optimized are cast in terms that allow them to be jointly optimized with respect to a selected set of performance characteristics.

(2) Physical Embodiments

The present invention has three principal "physical" embodiments. The first is a system for jointly optimizing a linear signal processing filter and a subband filter, typically in the form of a computer system operating software or in the form of a "hard-coded" instruction set. This system is used in order to generate optimized filter sets based on a predetermined performance criterion. The second physical embodiment is a method, typically in the form of software, operated using a data processing system (computer). The third principal physical embodiment is a computer program product. The computer program product generally represents computer readable code stored on a computer readable medium such as an optical storage device, e.g., a compact disc (CD) or digital versatile disc (DVD), or a magnetic storage device such as a floppy disk or magnetic tape. Other, non-limiting examples of computer readable media include hard disks, read only memory (ROM), and flash-type memories. In addition to embodiments designed for producing jointly optimized filter sets, the present invention also encompasses the jointly optimized filter sets produced. These embodiments will be described in more detail below.

A block diagram depicting the components of a computer system used in the present invention is provided in FIG. 1. The data processing system 100 comprises an input 102 for inputting or determining a design scheme for a linear filter and a subband filter, where the design schemes of the linear filter and subband filter are related by a relationship therebetween. The input 102 is connected with the processor 106 for providing information thereto. A memory 108 is connected with the processor 106 for storing data and software to be manipulated by the processor 106. An output 104 is connected with the processor for outputting information such as the jointly optimized filters or performance data regarding them. Note that although the present invention is discussed in terms of a single linear signal processing filter and a single subband filter, it may be extended for jointly optimizing multiple linear signal processing filters and subband filters.

Figure 2:
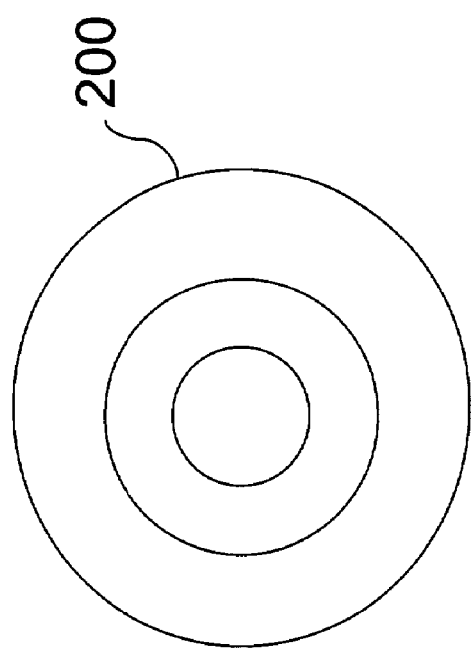
FIG. 2 is an illustrative diagram of a computer program product embodying the present invention.

An illustrative diagram of a computer program product embodying the present invention is depicted in FIG. 2. The computer program product 200 is depicted as an optical disk such as a CD or DVD. However, as mentioned previously, the computer program product generally represents computer readable code stored on any compatible computer readable medium.

(3) Introduction

The present invention provides method for jointly optimizing the performance of a linear signal processing filter (presented in the examples discussed herein as a correlation filter optimized with respect to recognition) with the compression capability of a subband filter (presented in the examples discussed herein as a quadrature mirror filter (QMF) for a subband coder optimized with respect to compression capability). As a result of the joint optimization, the performance of the jointly designed filters is superior to that of the independently designed filters. Although discussed in terms of specific filters for clarity of illustration, it should be appreciated that the present invention can be used to optimize the performance of any number of linear signal processing filters and subband filters with respect to a desired performance characteristic (e.g. compression, recognition, noise reduction, etc.).

The discussion herein is in the context of the joint optimization of a correlation filter and a quadrature mirror filter (QMF) for a subband coder. The correlation filter is optimized with respect to its ability to perform recognition operations and the QMF filter is optimized with respect to its ability to perform image reconstruction. Therefore, for purposes of this example, the ability of the correlation filter to perform recognition operations is considered more important than the ability to reconstruct images, so when tradeoffs occur, they are settled in favor of greater recognition ability rather than reconstruction accuracy (again, this is not necessary, but is useful for illustrative purposes in this example). On the problem of compressed data, the performance of the jointly designed filters on compressed data was found to be superior to that of the independently designed filters on equivalent uncompressed data. The joint optimization described herein has resulted in 100% recognition performance on a three class synthetic aperture radar (SAR) image for compression ratios of up to 6:1. The independently design filters operating on the equivalent uncompressed data achieve only 96% correct recognition.

The present invention may be applied, for example, to the manipulation of material in large databases. It may also be used in the manipulation of data that must be compressed because it is transmitted over a limited bandwidth. The joint optimization technique specified by this patent can also be used to perform linear signal processing operations on stored data. A few other, non-limiting examples of applications of the present invention include remote sensing and image exploitation; signal classification; object detection and collision avoidance in vehicles; occupant sensing in vehicles; pedestrian detection; and in future image architecture designs.

As mentioned before, the present invention is described in the context of correlation filters, which are used for object recognition. In a broader context, any linear signal processing filter can be substituted for the correlation filter. However, the performance metric for the linear signal processing filter will vary depending on its objective. Furthermore, for similar reasons, this discussion is also in the context of the use of a quadrature mirror filter (QMF) for the subband filter, although any type of subband filters could be used, with the proper changes made to the appropriate equations.

This discussion is organized as follows. Section I details the interaction of the linear signal processing filter and the subband filter (correlation filter and QMF designs, respectively), which the optimization technique interweaves. A quantizer and encoding scheme are provided for determining metrics for assessing system performance at varying bit rates, and are described in Section II. Next, example results are presented for the joint optimization using the Signal Processing Subband Coder (SPSC) for both optimized and unoptimized conditions in Section III, as well as quantization effects on optimized performance. Then, Section IV provides a summary of the benefits of the joint optimization technique. Finally, an Appendix is presented in Section V to assist in providing a better understanding of this invention, detailing a matrix representation of the subband decomposition.

I. Joint Optimization Design Criterion

To provide intelligent image compression and tailor it for object recognition, the QMF bank of the subband coder is modified. The premise is that one can tune the subband filters to impact the information content of the subbands in a manner that is useful to object recognition (a similar premise applies to any jointly optimized filter, based on the desired characteristics to be jointly optimized). Toward that end, a new term is introduced that incorporates recognition performance into the design of the QMF. Likewise, the QMF response at every iteration of the design is included in the correlation filter. FIG. 3(a) generally illustrates the design approach to jointly optimizing the performance of the two systems. Although the figure is depicted as specific to correlation filtering, any linear filter can be placed within the loop, provided that some quantitative performance measure can be assessed from such filter. The iterative approach tunes the two filters based on the competing goals of perfect reconstruction 300 and optimal recognition 302, iteratively arriving at the best possible compromise between the two for a given situation.

Figure 3B:
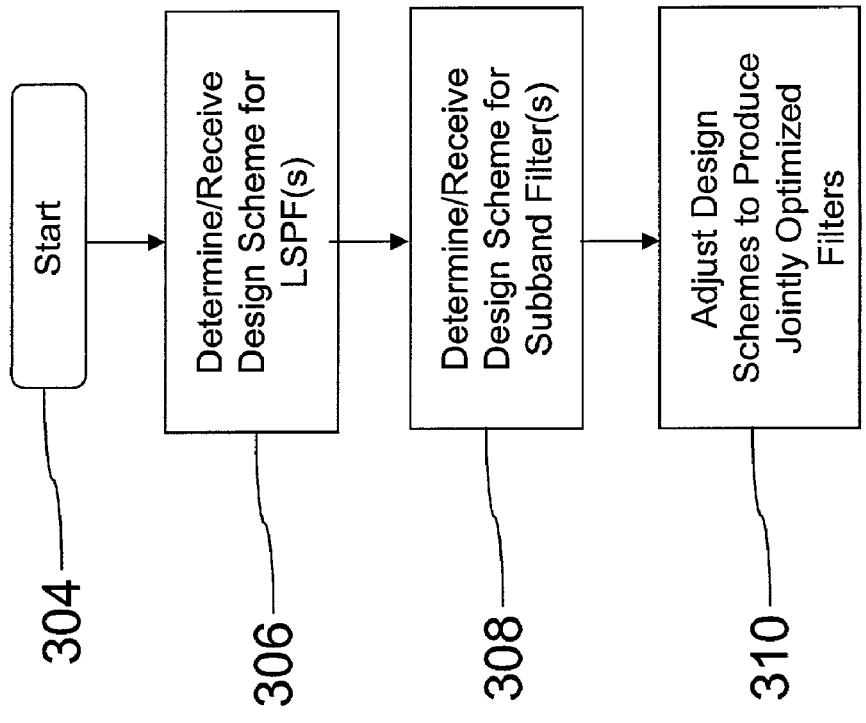
FIG. 3(b) is a flow chart depicting the steps of an embodiment of the present invention.
Figure 3A:
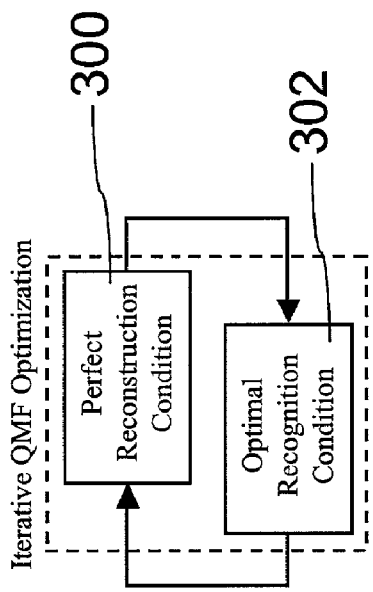
FIG. 3(a) is a flow diagram illustratively depicting the optimization procedure used with the present invention.

A flow chart depicting the steps in this technique is shown in FIG. 3(b). After the start block 304, the design scheme for the linear signal processing filter (the correlation filter here) is determined or received into a computer system 306. Next, the design scheme for the subband filter (the QMF here) is determined or received into the computer system 308. After the design schemes (the definitions of the filters) have been received, they are related so that they may be jointly optimized with respect to at least one performance characteristic, and their design schemes are adjusted in order to produce the final set of jointly optimized filters 310. The filters may then be used for their desired task.

For the specific case of the correlation filter, a Lagrangian objective function directly relates to the success of the correlation process (by maximizing an in-class response and minimizing an out-of-class response). Thus, quantity $$J(c) = \text{real}(m^T c) \qquad (1.1)$$

is used to gauge the performance of the correlation filter c. Yet, the quantity m (the mean of all the reconstructed images) is directly dependent on the subband transform, and hence the QMF. Furthermore, c is dependent on m. Thus, it is desirable to optimize the QMF in order to maximize the value of J.

Before discussing the joint optimization, the baseline QMF design equation is presented. A quadrature mirror filter (QMF) bank consists of a lowpass and highpass filter, $h_0(n)$ and $h_1(n)$, whose purpose is to split a one-dimensional signal into two frequency bands. The QMF design is an iterative optimization procedure which involves the minimization of several errors, the summation of which is represented by f in Equation (1.2) below. Note that f is the sum of the aliasing distortion (subscript ald), the amplitude distortion (subscript amd), and the DC distortion (subscript dc). These components are shown in order in both forms of Equation (1.2) below, separated by the plusses.

$$f = \varepsilon_{ald} + \varepsilon_{amd} + \varepsilon_{dc} \qquad (1.2)$$

$$f = \sum_{i \neq j} [(T^T T)_{ij}]^2 + (h_0^T h_0 - 1)^2 + \left( \sum_{n=1}^{N_f} h_0(n) - \sqrt{2} \right)^2$$

A numerical optimization routine is used to find the coefficients of $h_0(n)$ that minimize the function f. The coefficients of $h_1(n)$ are then determined by the following rule.

$$h_1(n) = (-1)^n h_0(n) \qquad (1.3)$$

The matrix T is defined from the coefficients of $h_0(n)$, with a detailed description of its construction given in the Appendix.

To jointly optimize the compression and recognition filter solutions, a fourth term is added to the baseline QMF design equation. This is the step of relating the design schemes for the filters, which allows for their simultaneous optimization. The inverse of the Lagrangian is treated as an error term, provoking the QMF design to increase (for each object class) the J term of Equation (1.1) with every iteration.

$$\varepsilon_{rec} = \sum_{k=1}^{K} \frac{1}{J_k}, \text{ where } J_k = \text{real}(m_k^T * c_k) \qquad (1.4)$$

Accordingly, the full-fledged joint optimization equation follows from Equation (1.2). Note that recognition error is denoted by the subscript rec in Equation (1.5).

$$f = \varepsilon_{ald} + \varepsilon_{amd} + \varepsilon_{dc} + \varepsilon_{rec} \qquad (1.5)$$

$$f = \sum_{i \neq j} [(T^T T)_{ij}]^2 + (h_0^T h_0 - 1)^2 +$$

$$\left( \sum_{n=1}^{N_f} h_0(n) - \sqrt{2} \right)^2 + G \sum_{k=1}^{K} \frac{1}{J_k}$$

The constant applied to the new term for the recognition error, $\epsilon_{rec}$, was determined empirically. A value of G of 17 achieved the highest PSNR value of the reconstructed image, while providing the maximum recognition performance. In other words, it provided the highest quality image reconstruction available while maintaining perfect recognition performance. By reducing this constant, the PSNR measure can be increased, but only at the expense of recognition success. Note that the constant can be varied to maximize PSNR or recognition performance as desirable for a particular embodiment. For other filter types, the same approach may be used in order to optimize whatever performance characteristics are desirable for a particular embodiment. Both a first order and a second order implementation are discussed below. The main difference between the two is the amount of computational resources used in the optimization (training) process. The optimization technique, however, is the same for both implementations.

First Order Implementation

The only downside of the above formulation is that a fall implementation requires decomposition and reconstruction of every image in the training set with every iteration of the QMF design. This is due to the fact that some of the terms in the correlation filter design are dependent on second order image statistics. With a first order implementation, however, only the m term of the correlation filter design is altered. This case requires decomposition and reconstruction of only the mean training image, m, with every QMF design iteration. The remaining terms were derived from the original training data, with no reconstruction. The first order training method is much quicker than the second order technique described below. Selection of the training design technique depends on the amount of time and computer resources available for training.

Second Order Implementation

In this case, every image in the training set was decomposed and reconstructed with every iteration of the QMF design. This allowed construction of both a new m and new second order terms with each iteration. Again, the first design objective used herein was to achieve the highest recognition performance, Pc, and secondly to produce the largest PSNR possible for that Pc value. Hence, in this case, the fourth constant of Equation (1.4) was empirically determined to be 29, rather than 17. Again, note that both the performance criteria and the optimization of the performance using the criteria are dependent on the particular goals of a system.

Results

Figure 4:
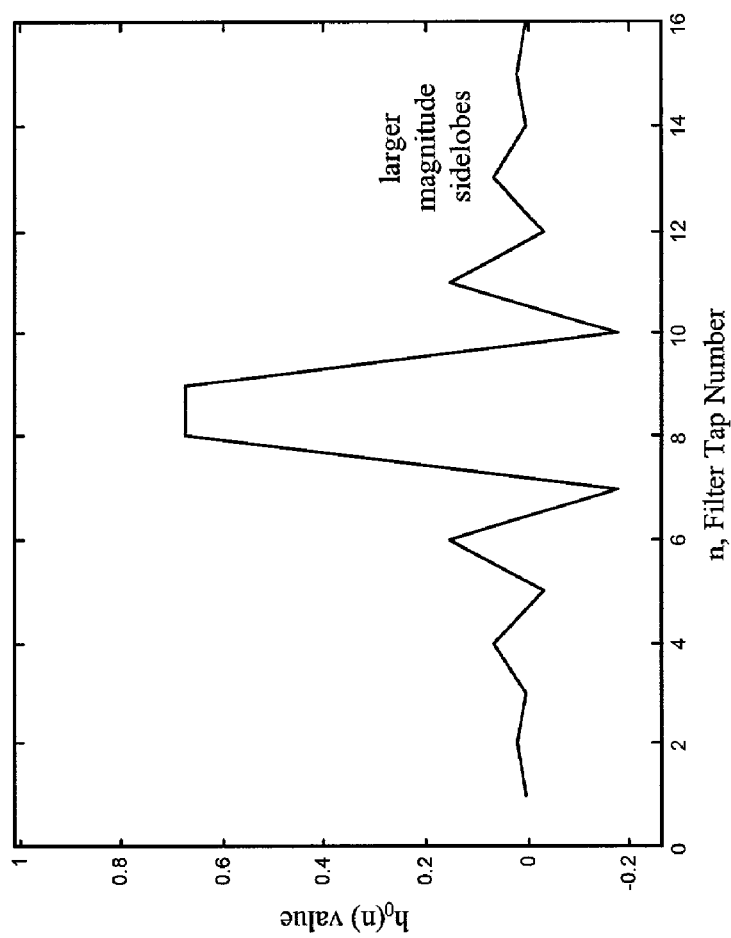
FIG. 4 is a graph of the time domain response of a quadrature mirror filter jointly optimized by the present invention.
Figure 5:
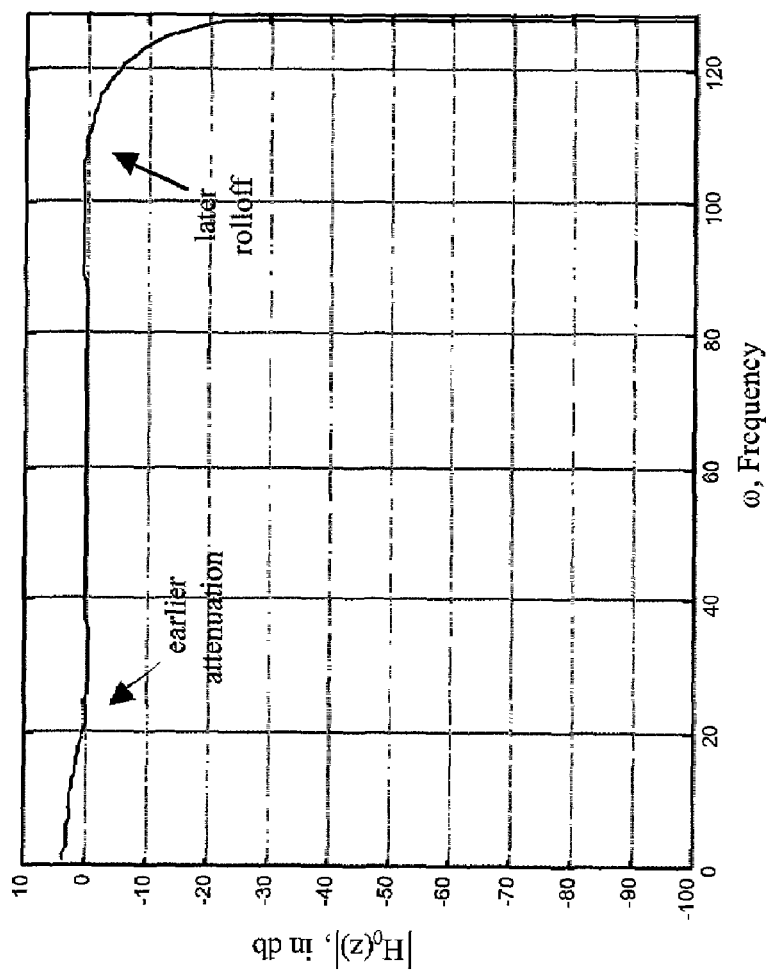
FIG. 5 is a graph of the frequency response of a quadrature mirror filter jointly optimized by the present invention.

The joint optimization QMF design (with a first order implementation) produced the time domain plot of $h_0(n)$ shown in FIG. 4, with a QMF filter length of 16. The magnitude of the frequency response of this filter, $H_0(z)$, is presented in FIG. 5. These two plots reveal the similarity of the jointly designed QMF with a standard subband filter. The compression (subband) design will be discussed next.

II. Compression System Design

In this section, the design of the quantizer and encoder are discussed in the context of a simple compression scheme. This is only necessary for a presentation of the example experimental results in Section III, below. In summary, a uniform step size is used to scalar quantize the subband coefficients, and then it is assumed that the data will be transmitted by an entropy coder with variable length codes and a finite length codebook.

Throughout all of the experiments discussed herein, quantization is applied only to the test data. The training phase utilizes reconstructed but unquantized image data. Prior to quantization, the bits are optimally allocated among the subbands with the well-known expression to minimize distortion by using the method of Lagrange. For a decomposition with M equal subbands, the number of bits allocated to the $k^{th}$ subband is given by $$R_k = R + \frac{1}{2}\log_2 \frac{\sigma_{y_k}^2}{\prod_{k=1}^{M}(\sigma_{y_k}^2)^{\frac{1}{M}}}, \quad (2.1)$$

where R is the average number of bits per pixel to be used in the reconstructed image (a.k.a. the target bit rate), and $\sigma_{y_k}^2$ is the variance of the coefficients in the $k^{th}$ subband. Because variable length codewords are assumed, $R_k$ can be a fractional value. Also, because this design is based on the set of training images, the maximum variance of each subband is used over the entire set of training images to define $R_k$.

It is also assumed that the encoder uses a finite length codebook so that the codewords can be stored a priori, i.e., transmission of codewords is not necessary. Thus, the number of quantization bins for each subband is defined as a constant. This design is based on the set of training images. That is, an average probability distribution function is constructed for each subband from the training set of images in order to determine the minimum quantization step size possible for the bit allocation $R_k$.

Because use of an entropy encoder is also assumed, entropy is used to determine the quantization step size. Entropy is computed by using the average probability distribution with the following equation:

$$H = -\sum_{i=1}^{N} p_i \log_2 p_i, \quad (2.2)$$

where N is the number of bins in the probability distribution. The probability distribution is quantized by a uniform quantization step size, $\Delta_q$. Initially, a very small quantization step size, $\Delta_q$, is used, and is incremented until $H_k$ is less than or equal to the specified $R_k$.

The test images are then scalar quantized according to Equation (2.3), which holds for positive or negative coefficient values.

$$q = \left\{\Delta_q \cdot \text{rnd}\left(\frac{x}{\Delta_q} + 0.5\right)\right\} - \left\{\text{sgn}(x) \cdot \frac{\Delta_q}{2}\right\} \quad (2.3)$$

In an operative system, each quantized value would be transmitted as a single codeword. Again, the codebook would be stored a priori at both the encoder and decoder, and a finite length codebook is assumed. If the training set is representative of the test images, then the number of quantization bins resulting from any test image should not exceed the number of codewords stored at the decoder. This was the case in all of the experiments discussed herein. In practice, accommodations would have to be made for images which are exceptions.

Note that with regard to the experiments discussed herein, no codebook was actually constructed. Once the quantization of the test images was complete, the average entropy was computed over the entire set (Equation (2.2)). Note further that actual bit rate never met the target bit rate exactly.

III. Performance

With the discussion above in mind, it is now possible to evaluate the performance of the jointly optimized compression and correlation filters. The design techniques described here are used to provide the filters used in an SPSC architecture described in the Appendix II. In the first set of experiments, the performance of the SPSC is compared with the results achieved with uncompressed image data. Assessment of the SPSC is done with the independent QMF and correlation filters, as well as the jointly optimized filter pair. Quantization is not applied to the subband coefficients during this first set of experiments. The second set of experiments then characterizes the SPSC performance over increased quantization (i.e., decreasing bit rate).

In the interest of clarity, the train and test sets used will not be discussed, as it would be tangential. A feature of these experiments is the relative improvement of jointly optimizing the design of the two filters rather than using an independent design. Both cases follow the same experiment conventions. Note that the correlation filters were trained with unquantized reconstructed image data.

III.a. Joint Optimization Effects

Here the recognition performances of four distinct systems are compared using a first set of experiments.

System Performance

A summary of the system performance metrics for the four systems is depicted in the table presented in FIG. 6. Additionally, FIG. 7 presents a table of the object recognition measures Pc (probability of correct classification), Pe (probability of error), and Pr (probability of rejection), as well as the reconstruction metrics PSNR and MSE for one of the test images.

Based on these tables, two observations are in order. First, the baseline SPSC system does as well as the one operating on the original (i.e., uncompressed) image data. Second, jointly optimizing the QMF and correlation filters improves the recognition performance of the SPSC, although it reduces the reconstruction veracity of the compression transform.

Discussion

Figure 8B:
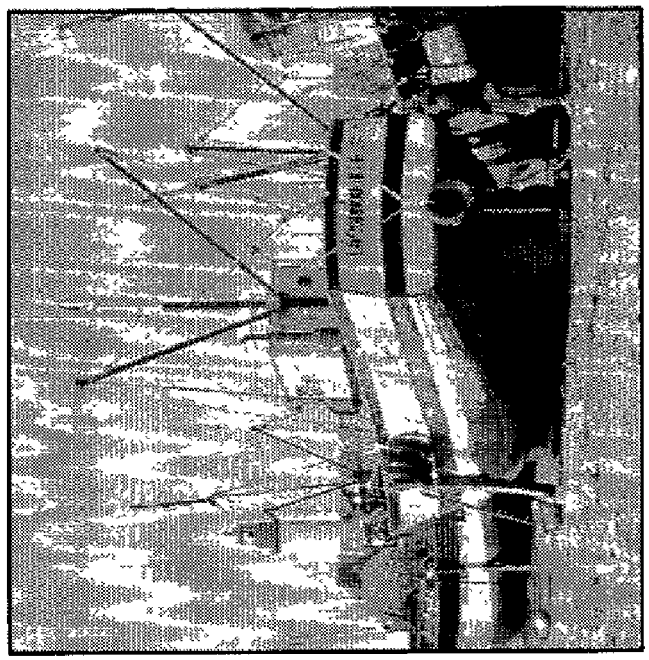
FIG. 8(b) depicts an image reconstructed after compressing the image depicted in FIG. 8(a) using the present invention.
Figure 8A:
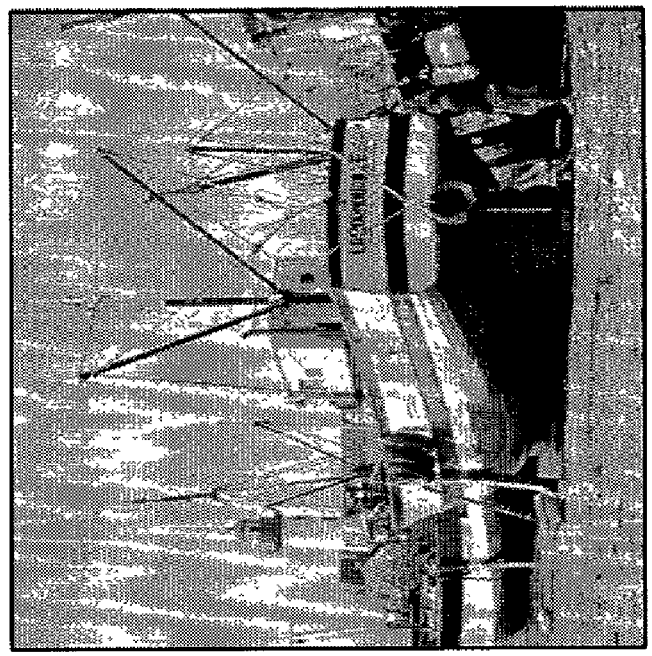
FIG. 8(a) depicts an original image used in an evaluation of an example embodiment of the present invention.

The main goal of the compression/recognition system used in these experiments is for content manipulation, not content visualization. Therefore, while high compression rates are of interest, tuning the compression model for object recognition rather than for visualization by a human observer is of greater concern. Accordingly, it is worthwhile to sacrifice perfect reconstruction for accurate recognition, as happens with the joint optimization of the filters. Moreover, the reconstruction of the image data is still quite good as exemplified in FIG. 8(a) and FIG. 8(b), which depict the original image and the reconstructed version, respectively. The reconstructed image has a PSNR of 26.4 and an MSE of 149.

Finally, although the second order joint optimization design performs slightly better, the first order implementation was selected for the next set of experiments. Selection of the training design technique depends on the amount of time and computer resources available for training. The first order technique is much quicker to implement. The technique of the present invention may also be tuned for optimizing compression subject to other desired performance characteristics, such as ensuring optimal reconstruction of an image for human viewing.

III.b. Quantization Effects

In this set of experiments, the performance of the SPSC over increased quantization (i.e., decreasing bit rate) is characterized. That is, "How will compression degrade the recognition performance of the SPSC?" The quantizer design used for these experiments was described in Section II.

Results

Figure 9:
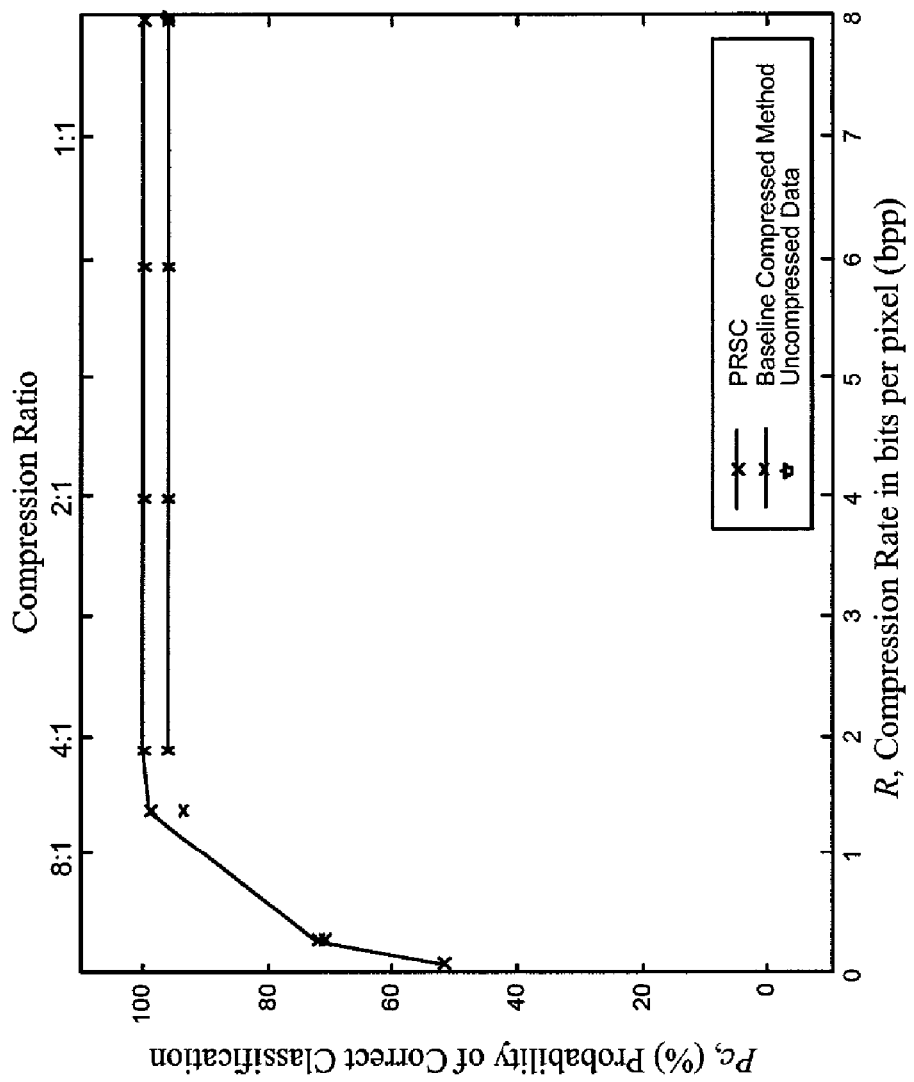
FIG. 9 is a graph depicting the relationship between the probability of correct classification and compression rate in bits per pixel, when using a jointly optimized correlation/compression filter pair.
Figure 10:
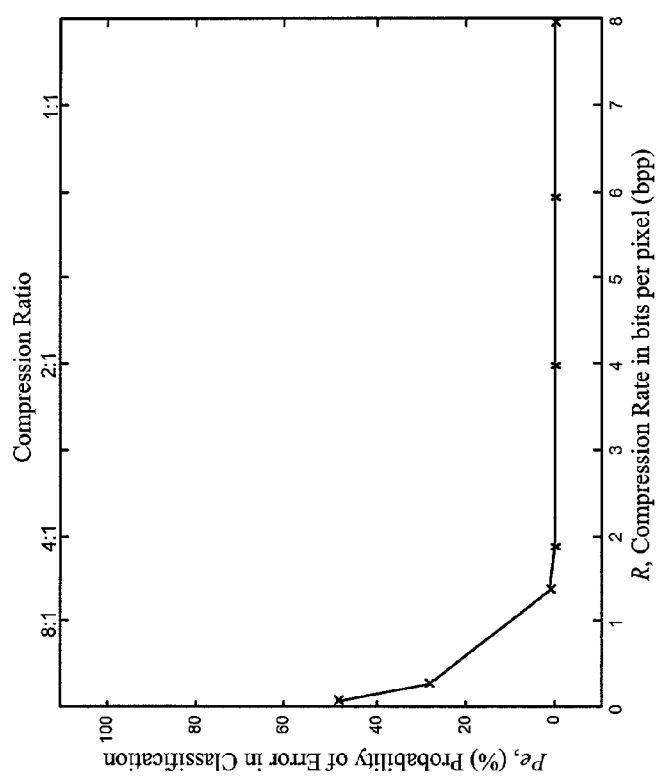
FIG. 10 is a graph depicting the relationship between the probability of error in classification and compression rate in bits per pixel, when using a jointly optimized correlation/compression filter pair.
Figure 11:
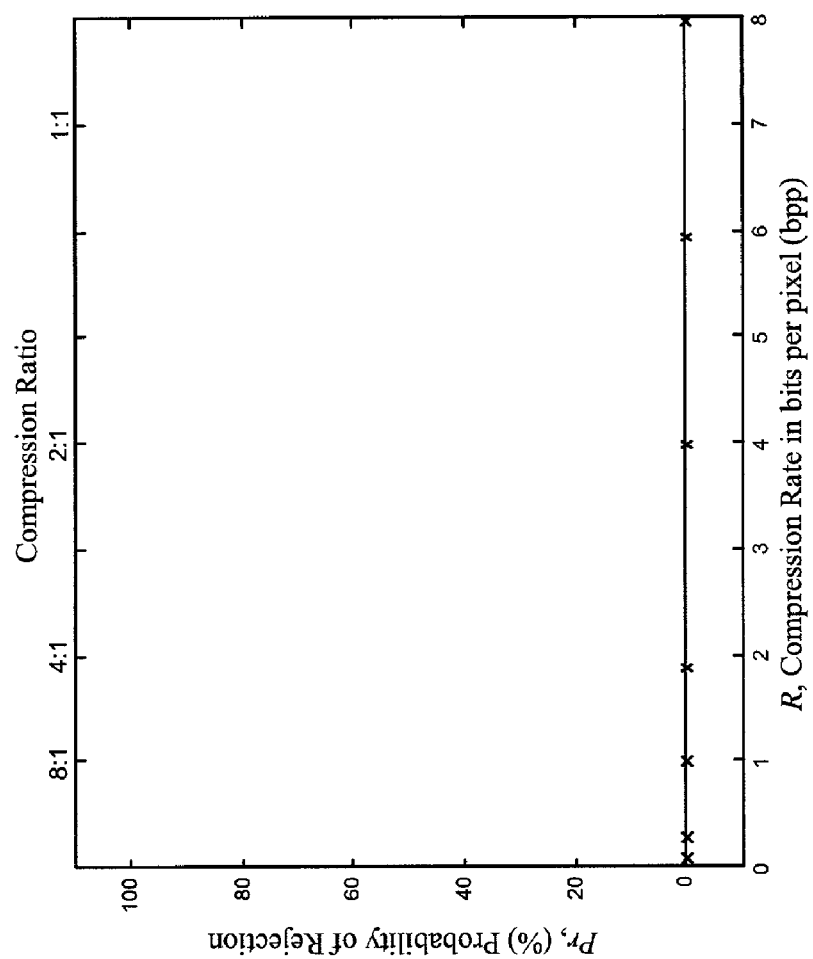
FIG. 11 is a graph depicting the relationship between the probability of rejection and compression rate in bits per pixel, when using a jointly optimized correlation/compression filter pair.

The following data summarizes the performance results of the SPSC with the joint optimization technique (as a first order implementation) in place. The object recognition measures Pc, Pe, and Pr are expressed as a function of bit rate, in the graphs shown in FIG. 9, FIG. 10, and FIG. 11, respectively. Thus, FIG. 9 presents a graph of the probability of correct classification versus bit rate; FIG. 10 presents a graph of the probability of error in classification versus bit rate; and FIG. 11 presents a graph of the probability of rejection versus bit rate. In FIG. 9, the SPSC performance is augmented with results from the baseline compression recognition system (fill image reconstruction prior to correlation) for comparison, as well as the performance of a correlation system operating on the original (uncompressed) data. The latter is shown with only one data point, at eight bpp. Reduced bit rates are not applicable to the uncompressed data.

Figure 12:
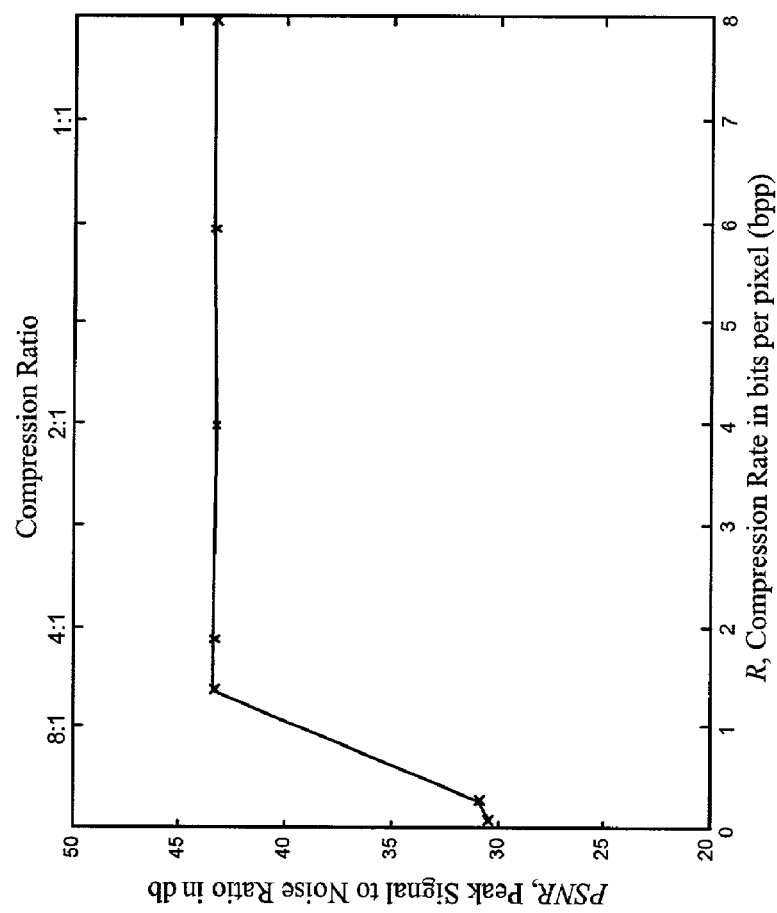
FIG. 12 is a graph depicting the relationship between the peak signal to noise ratio in dB and compression rate in bits per pixel, when using a jointly optimized correlation/compression filter pair.
Figure 13:
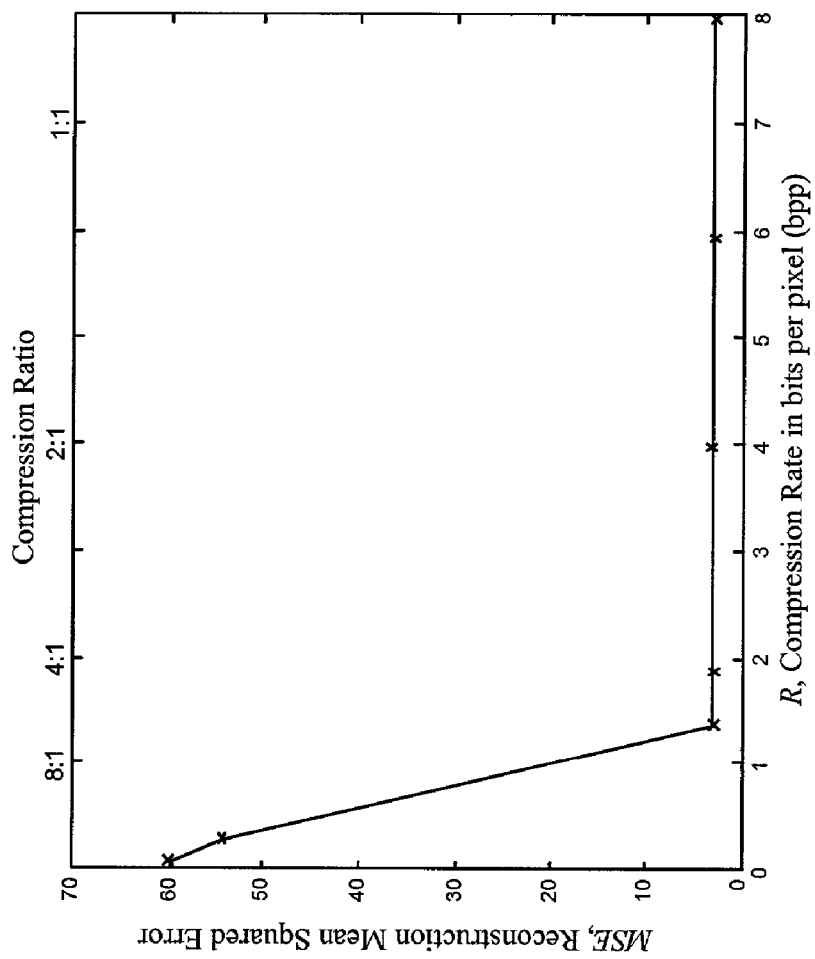
FIG. 13 is a graph depicting the relationship between the reconstruction mean squared error and compression rate in bits per pixel, when using a jointly optimized correlation/compression filter pair.

In this experiment, the jointly optimized QMF and correlation filter were used with the SPSC, whereas the baseline compression recognition system used the baseline QMF. In this case, the QMF and correlation filter were designed independently, with the correlation filter designed with the reconstructed but unquantized training data. The reconstruction metrics PSNR and MSE for the jointly optimized QMF are also shown in FIG. 12 and FIG. 13, respectively. In order to provide a succinct summary, the table depicted in FIG. 14 collects the results of FIG. 9, FIG. 10, and FIG. 11.

It is noteworthy that the Rate Error curve of FIG. 10 resembles a Rate Distortion curve and that the other curves depicted in FIG. 9 and FIG. 11 possess similar characteristics. That is, they maintain good performance down to very low bit rates and then drop off quickly. A slight drop in performance can be seen at 1.33 bpp, while a more significant drop off occurs at 0.28 bpp. The recognition performance curves (Pc, Pe, and Pr) allow tuning between the two ends of compression and recognition. An operating point can be selected depending on the application. The reconstruction metrics PSNR and MSE were computed from one of the test images and are exhibited for the jointly optimized QMF in the above figures.

Discussion

Three primary observations are in order. First, the SPSC performs very well according to the measures discussed herein. In fact, it always performs better than the baseline system. With only one-fourth of the information, the SPSC performs better than correlation on the original image data. This is primarily due to the joint optimization of the compression and recognition filters. The joint optimization tunes the correlation filter over all the frequency bands present in the subband coder, and vice-versa, it adapts the subband information in the best interests of the correlation filter.

At low bit rates, the encoding scheme begins to drop subbands. That is, at low bit rates, the quantizer does not have enough bits to effectively code all of the subbands on all levels. Hence, some of them are encoded with zero bits (effectively 'dropping' these subbands). The table depicted in FIG. 15 shows the bit rates which require empty subbands. As a result, the correlation output of the SPSC contains aliasing at compression ratios below 6:1 (corresponding with bit rates below 1.33 bpp). The aliasing in the correlation surface prohibits successful recognition.

Note that these results would benefit from employing a gainful coding technique, e.g., the Embedded Zerotree Wavelet coder (EZW). The EZW coder progressively transmits the subband coefficients in order of their magnitude regardless of their subband affiliation, and is well known to produce some of the best compression rates currently available for image data. By employing a superior encoding technique the already successful performance of the SPSC could be further improved. It is really a matter of the MSE at the output. It is worth noting that the reconstruction MSE increases from 9.6 to 39.4 between the two and one bpp rate as may be seen in FIG. 13. A better encoding technique could certainly decrease this MSE for even high compression ratios (low bit rates). In sum, FIG. 12 is a graph of the peak signal to noise ration (PSNR) versus bit rate; FIG. 13 is a graph of the reconstructed image mean squared error (MSE) versus bit rate; FIG. 14 is a table of the SPSC results as a function of bit rate; and FIG. 15 is a table of the subbands dropped at low bit rates.

IV. Summary

In the past, image compression and object recognition have been treated as separate problems. However, it is better to jointly optimize the performance of the two systems, rather than optimize each component individually. The compression/recognition system presented in this example is for automated object recognition, not human visualization. Therefore, recognition accuracy at a high compression rate is of primary interest, and the reconstruction fidelity of the compression transform is of secondary interest. Although not discussed herein, other criteria may readily be used, and the performance of the filters can be tuned accordingly.

The subband filter design is augmented to jointly optimize the performance of the QMF and correlation filters. This joint design provokes the QMF to adjust the subband frequency content to aid object discrimination, while simultaneously, it allows the correlation filter to adapt to the frequencies present in the subbands. Thus, based on the experiments discussed herein, the following conclusions may be drawn regarding this preferred implementation of the present invention.

The baseline SPSC uses a transformed image to perform object recognition at rates equal to that achieved with a correlation filter on the original image.

Jointly optimizing the QMF and correlation filters provides the SPSC with recognition accuracy superior to that of correlation on the original image, for compression ratios at least as high as 6:1.

Moreover, joint optimization of the QMF and correlation filters provides the SPSC with recognition accuracy equal to or better than that with their separate implementation at all bit rates.

The rate recognition curves provided by the SPSC allow a user to select an operating point and tune the system between the two opposing objectives of compression rate and recognition accuracy.

At compression ratios higher than 6:1, the performance of the SPSC can be further improved by using a more sophisticated encoding scheme such as the EZW coder.

V. Appendix—Matrix Formulation of a Subband Decomposition

This Appendix is provided for clarity and to assist the reader in understanding the concepts presented herein. A review of Equations (1.2)–(1.4) suggests that it would be helpful to formulate the subband transforms in matrix representations. Section I, above, briefly introduced this construction; a more formal treatment is presented here. In Section I, the T matrix was discussed for the purpose of a single recursion level. Now, the more general case of multiple recursion levels is presented. The formulation presented here evolved from the work of Mahalanobis, et. al (A. Mahalanobis, S. Song, M. Petragalia and S. K. Mitra, "Adaptive FIR Filters Based on Structural Subband Decomposition for System Identification Problems," *IEEE Trans. on Circ. and Sys.*, 40, pp. 354–362, June 1993), which may be consulted for further background regarding a matrix representation of subband decomposition based on the Hadamard transform.

Central to the following discussion is the fact that the matrix representation developed here combines the filtering and downsampling of a subband analysis transform over multiple levels in a matrix structure. In the interest of clarity, the discussion is limited to the one-dimensional case, though the same discussion could readily be expanded to multi-dimensional cases by one of skill in the art.

To start, let $x=[x(0) x(1) \ldots x(L-1)]$ be a vector of length L which contains the samples of the signal $x(n)$. For simplicity, it is assumed that $L=2^M$, where M is any positive integer. It is further assumed that the subband analysis filters $h_0(n)$ and $h_1(n)$ of length N, decompose $x(n)$ into two new subsequences $x_0(n)$ and $x_1(n)$. In matrix-vector notation, the decomposition of x into two subsequences $x_0$ and $x_1$ of length $(L+N-2)/2$ can be succinctly expressed as:

$$x_1 = A_1 x$$

, and $$x_2 = A_2 x \quad (5.1)$$

$$x = A_1^t x_1 + A_2^t X_2 \quad ; (5.2)$$

where $A_0$ and $A_1$ are unitary transform matrices of size $(L+N-2)/2$ by L. $A_0$ and $A_1$ satisfy the conditions $A_0^t A_0 = I$, $A_1^t A_1 = I$, and $A_0^t A_1 = 0$. These matrices are constructed from the subband analysis filters as follows:

$$A_0 = \begin{bmatrix} h_0(1) & h_0(0) & 0 & 0 & \cdots & \cdots & 0 & 0 \\ h_0(4) & h_0(3) & h_0(1) & h_0(0) & \cdots & \cdots & 0 & 0 \\ \vdots & & \vdots & \ddots & \ddots & \ddots & \vdots & \vdots \\ 0 & 0 & \cdots & \cdots & h_0(N-1) & h_0(N-2) & h_0(N-3) & h_0(N-4) \\ 0 & 0 & \cdots & \cdots & \cdots & 0 & h_0(N-1) & h_0(N-2) \end{bmatrix} \quad (5.3)$$

$$A_1 = \begin{bmatrix} h_1(1) & h_1(0) & 0 & 0 & \cdots & \cdots & 0 & 0 \\ h_1(4) & h_1(3) & h_1(1) & h_1(0) & \cdots & \cdots & 0 & 0 \\ \vdots & & \vdots & \ddots & \ddots & \ddots & \vdots & \vdots \\ 0 & 0 & \cdots & \cdots & h_1(N-1) & h_1(N-2) & h_1(N-3) & h_1(N-4) \\ 0 & 0 & \cdots & \cdots & \cdots & 0 & h_1(N-1) & h_1(N-2) \end{bmatrix}.$$

The rows of $A_0$ and $A_1$ are shifted versions of the subband filters, appropriately padded with zeros to implement the required filtering and decimation. As a result, the matrix-vector multiplication of Equation (5.1) yields the desired filtered and downsampled subband sequences. The relation between the subband sequences and the original signal can also be expressed as:

$$\begin{bmatrix} x_0 \\ x_1 \end{bmatrix} = \begin{bmatrix} A_0 \\ A_1 \end{bmatrix} x = Tx, \quad (5.4)$$

where $$T = \begin{bmatrix} A_0 \\ A_1 \end{bmatrix}$$

may be considered to be a one level decomposition matrix for splitting a signal into two subbands. Because the subband decomposition matrices are unitary, it follows that $T^t T = I$, and $$x = T^t \begin{bmatrix} x_0 \\ x_1 \end{bmatrix}, \quad (5.5)$$

which is the inverse decomposition (i.e., synthesis) equation.

Figure 16:
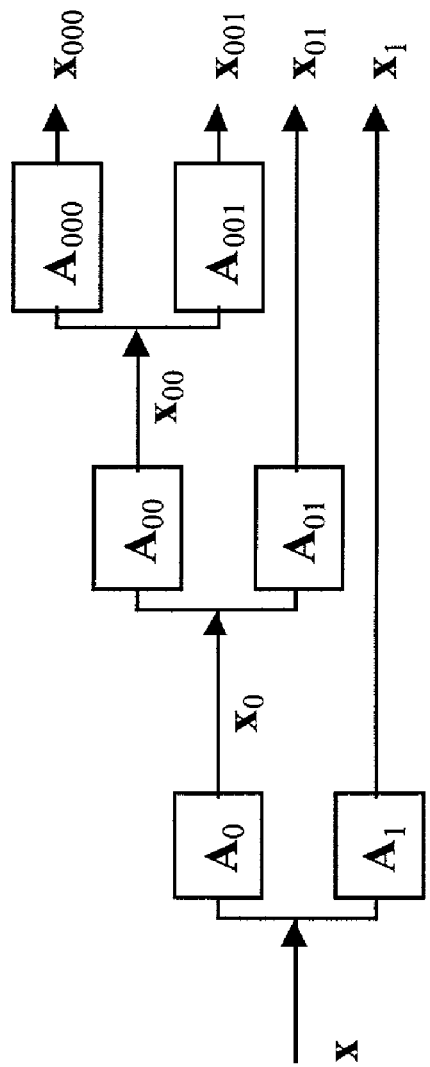
FIG. 16 is a block diagram depicting a three-level dyadic decomposition of a one-dimensional signal.

Furthermore, the structure of T can be generalized to represent any one to M band transformation including partial decompositions and the maximally decimated case. Here, the focus of attention is on the structure of T for the case of a dyadic hierarchical decomposition in which only the low frequency signal is recursively decomposed. FIG. 16 diagrams this process for a three level decomposition of the signal x, in which the low frequency signal is recursively decomposed to form a one-dimensional subband decomposition.

The process in FIG. 16 leads to the following set of equations.

$$x_{000} = A_{000} x_{00} = A_{000} A_{00} x_0 = A_{000} A_{00} A_0 x$$

$$x_{001} = A_{001} x_{00} = A_{001} A_{00} x_0 = A_{001} A_{00} A_0 x$$

$$x_{01} = A_{01} x_0 = A_{01} A_0 x$$

$$x_1 = A_1 x \quad (5.6)$$

In the above equations, the symbols '0' and '1' refer to the branch of the dyadic tree being traversed. The number of symbols in the subscripts indicates the stage of the decomposition. Thus, the subscript '001' refers to quantities in the second subband at the third stage of the decomposition process. All the subband decomposition matrices are of the type in Equation (5.3), but are appropriately dimensioned to match the lengths of the input and output signals at each stage. Based on the above formulation, it is now easy to see that the relation between the input signal and the subband output is given by:

$$\begin{bmatrix} x_{000} \\ x_{001} \\ x_{01} \\ x_1 \end{bmatrix} = \begin{bmatrix} A_{000}A_{00}A_0 \\ A_{001}A_{00}A_0 \\ A_{01}A_0 \\ A_1 \end{bmatrix} x = Tx, \text{ where} \quad (5.7)$$

$$T = \begin{bmatrix} A_{000}A_{00}A_0 \\ A_{001}A_{00}A_0 \\ A_{01}A_0 \\ A_1 \end{bmatrix} \quad (5.8)$$

is the three level decomposition matrix that implements the process shown in FIG. 16. Again, because each of the subband decomposition matrices which comprise T are unitary, it follows that $T^tT=I$, and that the expression for synthesis is given by $$x = T^t \begin{bmatrix} x_{000} \\ x_{001} \\ x_{01} \\ x_1 \end{bmatrix}. \quad (5.9)$$

Now, consider the case where the analysis and synthesis filter banks are not unitary or orthogonal, but rather biorthogonal, as is the case with many wavelets. The above equations and discussion still hold, with the exception that the biorthogonal matrix U replaces $T^t$, and $TU=I$. The matrix U is formed in a manner analogous to the way T is formed, except that the submatrices, $A_0$ and $A_1$, are composed from the subband synthesis filters, rather than from the subband analysis filters. In fact, as long as the forward transform is invertible, the matrix formulation T is applicable. (T has to be nonsingular, and thus invertible.) In this case, $T^{-1}$ is formed from the inverse transform filters, rather than the forward transform filters.

Figure 17:
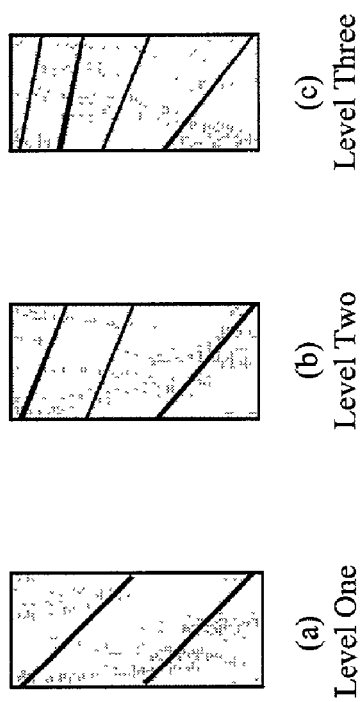
FIG. 17(a) is a depiction of a one level T matrix created from a four tap filter.
FIG. 17(b) is a depiction of a two-level T matrix created from a four tap filter.
FIG. 17(c) is a depiction of a three-level T matrix created from a four tap filter.

For illustration purposes, FIG. 17(a), FIG. 17(b), and FIG. 17(c) portray one, two, and three level T matrices, respectively, created from a four tap filter. Matrix multiplication of the one level T matrix of FIG. 17(a) with an image in both the row and column directions will result in a four-level subband decomposition. Likewise, matrix multiplication of an image in both row and column directions with the three-level T matrix of FIG. 17(c) will result in a three-level subband decomposition.

For further clarity, in FIG. 17(a), the upper and lower diagonal bands represent the low and high-pass subband filters, respectively. The upper two diagonals of FIG. 17(b) represent the low and high-pass filtering process for level two, while the lowest diagonal designates the high-pass operation of level one. Finally, in FIG. 17(c), the upper two diagonals accomplish the low and high-pass filtering operations of level three; the next diagonal band depicts the high-pass level two operation; the lowest diagonal band affects the level one high-pass filtering process. Notice the increased decimation of the diagonal structures for the higher decomposition levels (lower levels of resolution).

In summary, the matrix construct T collapses the complete subband hierarchy into an aggregate structure which provides a direct channel from input to output and vice-versa. Multiplying an input image (in both the row and column direction) with an M level T matrix results in an M level decomposition with (3M+1) bands. Thus, the matrix T provides a single to multiple band relationship.

What is claimed is:

1. A method for generating a set of jointly optimized linear signal processing filters and subband filters for processing digital data on a computer system, the method comprising the steps of:
    determining a design scheme for at least one linear signal processing filter, with the design scheme for at least one linear signal processing filter dependent upon at least one performance characteristic;
    determining a design scheme for at least one subband filter, with the design scheme for at least one subband filter dependent upon at least one performance characteristic;
    relating the design scheme for the at least one linear signal processing filter and the design scheme for the at least one subband filter in order to determine a relationship therebetween; and
    jointly adjusting the design scheme for the at least one linear signal processing filter and the design scheme for the at least one subband filter using the relationship therebetween to optimize at least one desirable performance characteristic; whereby a set of linear signal processing filters and subband filters are optimized together in order to provide better data processing performance with regard to the at least one desirable performance characteristic than would be available without optimization.

2. A method for generating a set of jointly optimized linear signal processing filters and subband filters as set forth in claim 1, wherein the at least one linear signal processing filter is selected from a group consisting of correlation filters, noise-reduction filters, and data manipulation filters; and wherein the at least one subband filter is selected from a group consisting of compression filters and encryption filters.

3. A set of at least one linear signal processing filter and at least one subband filter produced by the method of claim 2.

4. A method for generating a set of jointly optimized linear signal processing filters and subband filters as set forth in claim 1, wherein one linear signal processing filter and one subband filter are optimized, and where the linear signal processing filter is a correlation filter and the subband filter is a compression filter, and where the correlation filter and the compression filter are optimized for object recognition for image data in image datasets.

5. A method for generating a set of jointly optimized linear signal processing filters and subband filters as set forth in claim 4, wherein the compression filter is a quadrature mirror filter.

6. A method for generating a set of jointly optimized linear signal processing filters and subband filters as set forth in claim 5, wherein the design scheme used for the correlation filter is a Lagrangian objective function for optimizing the correlation process by maximizing an in-class response and minimizing an out-of-class response, and where the design scheme used for the quadrature mirror filter is an iterative optimization procedure for optimizing a set of error terms comprising an amplitude distortion error term, an aliasing distortion error term, and a DC error term; whereby the correlation filter's ability to perform recognition is maximized and the quadrature mirror filter's ability to perform data compression is maximized without sacrificing the recognition ability of the correlation filter, thus optimizing quantization.

7. A method for generating a set of jointly optimized linear signal processing filters and subband filters as set forth in claim 6, further comprising a step of optimizing the data compression of the quadrature mirror filter by employing an encoding optimizer.

8. A set of at least one linear signal processing filter and at least one subband filter produced by the method of claim 7.

9. A set of at least one linear signal processing filter and at least one subband filter produced by the method of claim 4.

10. A set of at least one linear signal processing filter and at least one subband filter produced by the method of claim 5.

11. A set of at least one linear signal processing filter and at least one subband filter produced by the method of claim 6.

12. A set of at least one linear signal processing filter and at least one subband filter produced by the method of claim 1.

13. An apparatus for generating a set of jointly optimized linear signal processing filters and subband filters, the apparatus comprising a computer system including a processor, a memory coupled with the processor, an input coupled with the processor for receiving data, and an output coupled with the processor for outputting data, wherein the computer system further comprises means, residing in its processor and memory, for:
  receiving, via the input, a design scheme for at least one linear signal processing filter, with the design scheme for at least one linear signal processing filter dependent upon at least one performance characteristic;
  receiving, via the input, a design scheme for at least one subband filter, with the design scheme for at least one subband filter dependent upon at least one performance characteristic;
  relating the design scheme for the at least one linear signal processing filter and the design scheme for the at least one subband filter by a relationship therebetween; and
  jointly adjusting the design scheme for the at least one linear signal processing filter and the design scheme for the at least one subband filter using the relationship therebetween to optimize at least one desirable performance characteristic; whereby a set of linear signal processing filters and subband filters are optimized together in order to provide better data processing performance with regard to the at least one desirable performance characteristic than would be available without optimization.

14. An apparatus for generating a set of jointly optimized linear signal processing filters and subband filters as set forth in claim 13, wherein the at least one linear signal processing filter is selected from a group consisting of correlation filters, noise-reduction filters, and data manipulation filters; and wherein the at least one subband filter is selected from a group consisting of compression filters and encryption filters.

15. A set of at least one linear signal processing filter and at least one subband filter produced by the apparatus of claim 14.

16. An apparatus for generating a set of jointly optimized linear signal processing filters and subband filters as set forth in claim 13, wherein one linear signal processing filter and one subband filter are optimized, and where the linear signal processing filter is a correlation filter and the subband filter is a compression filter, and where the correlation filter and the compression filter are optimized for object recognition for image data in image datasets.

17. An apparatus for generating a set of jointly optimized linear signal processing filters and subband filters as set forth in claim 16, wherein the compression filter is a quadrature mirror filter.

18. An apparatus for generating a set of jointly optimized linear signal processing filters and subband filters as set forth in claim 17, wherein the design scheme used for the correlation filter is a Lagrangian objective function for optimizing the correlation process by maximizing an in-class response and minimizing an out-of-class response, and where the design scheme used for the quadrature mirror filter is an iterative optimization procedure for optimizing a set of error terms comprising an amplitude distortion error term, an aliasing distortion error term, and a DC error term; whereby the correlation filter's ability to perform recognition is maximized and the quadrature mirror filter's ability to perform data compression is maximized without sacrificing the recognition ability of the correlation filter, thus optimizing quantization.

19. A method for generating a set of jointly optimized linear signal processing filters and subband filters as set forth in claim 18, further comprising a means for optimizing the data compression of the quadrature mirror filter by employing an encoding optimizer.

20. A set of at least one linear signal processing filter and at least one subband filter produced by the apparatus of claim 19.

21. A set of at least one linear signal processing filter and at least one subband filter produced by the apparatus of claim 16.

22. A set of at least one linear signal processing filter and at least one subband filter produced by the apparatus of claim 17.

23. A set of at least one linear signal processing filter and at least one subband filter produced by the apparatus of claim 18.

24. A set of at least one linear signal processing filter and at least one subband filter produced by the apparatus of claim 13.

25. An apparatus for generating a set of jointly optimized linear signal processing filters and subband filters, the apparatus comprising a computer system including a processor, a memory coupled with the processor, an input coupled with the processor for receiving data, and an output coupled with the processor for outputting data, wherein the computer system further comprises:
  a module for receiving, via the input, a design scheme for at least one linear signal processing filter, with the design scheme for at least one linear signal processing filter dependent upon at least one performance characteristic;
  a module for receiving, via the input, a design scheme for at least one subband filter, with the design scheme for at least one subband filter dependent upon at least one performance characteristic;

a module for relating the design scheme for the at least one linear signal processing filter and the design scheme for at least one subband filter by a relationship therebetween; and a module for jointly adjusting the design scheme for at least one linear signal processing filter and the design scheme for at least one subband filter using the relationship therebetween to optimize at least one desirable performance characteristic; whereby a set of linear signal processing filters and subband filters are optimized together in order to provide better data processing performance with regard to the at least one desirable performance characteristic than would be available without optimization.

26. An apparatus for generating a set of jointly optimized linear signal processing filters and subband filters as set forth in claim 25, wherein the at least one linear signal processing filter is selected from a group consisting of correlation filters, noise-reduction filters, and data manipulation filters; and wherein the at least one subband filter is selected from a group consisting of compression filters and encryption filters.

27. A set of at least one linear signal processing filter and at least one subband filter produced by the apparatus of claim 26.

28. An apparatus for generating a set of jointly optimized linear signal processing filters and subband filters as set forth in claim 25, wherein one linear signal processing filter and one subband filter are optimized, and where the linear signal processing filter is a correlation filter and the subband filter is a compression filter, and where the correlation filter and the compression filter are optimized for object recognition for image data in image datasets.

29. An apparatus for generating a set of jointly optimized linear signal processing filters and subband filters as set forth in claim 28, wherein the compression filter is a quadrature mirror filter.

30. An apparatus for generating a set of jointly optimized linear signal processing filters and subband filters as set forth in claim 29, wherein the design scheme used for the correlation filter is a Lagrangian objective function for optimizing the correlation process by maximizing an in-class response and minimizing an out-of-class response, and where the design scheme used for the quadrature mirror filter is an iterative optimization procedure for optimizing a set of error terms comprising an amplitude distortion error term, an aliasing distortion error term, and a DC error term; whereby the correlation filter's ability to perform recognition is maximized and the quadrature mirror filter's ability to perform data compression is maximized without sacrificing the recognition ability of the correlation filter, thus optimizing quantization.

31. A method for generating a set of jointly optimized linear signal processing filters and subband filters as set forth in claim 30, further comprising a module for optimizing the data compression of the quadrature mirror filter by employing an encoding optimizer.

32. A set of at least one linear signal processing filter and at least one subband filter produced by the apparatus of claim 31.

33. A set of at least one linear signal processing filter and at least one subband filter produced by the apparatus of claim 28.

34. A set of at least one linear signal processing filter and at least one subband filter produced by the apparatus of claim 29.

35. A set of at least one linear signal processing filter and at least one subband filter produced by the apparatus of claim 30.

36. A set of at least one linear signal processing filter and at least one subband filter produced by the apparatus of claim 25.

37. A computer program product for generating a set of jointly optimized linear signal processing filters and subband filters, the computer program product comprising means, stored on a computer readable medium, for:

receiving a design scheme for at least one linear signal processing filter, with the design scheme for at least one linear signal processing filter dependent upon at least one performance characteristic;

receiving a design scheme for at least one subband filter, with the design scheme for at least one subband filter dependent upon at least one performance characteristic;

relating the design scheme for at least one linear signal processing filter and the design scheme for at least one subband filter by a relationship therebetween; and jointly adjusting the design scheme for at least one linear signal processing filter and the design scheme for at least one subband filter using the relationship therebetween to optimize at least one desirable performance characteristic; whereby a set of linear signal processing filters and subband filters are optimized together in order to provide better data processing performance with regard to the at least one desirable performance characteristic than would be available without optimization.

38. A computer program product for generating a set of jointly optimized linear signal processing filters and subband filters as set forth in claim 37, wherein the at least one linear signal processing filter is selected from a group consisting of correlation filters, noise-reduction filters, and data manipulation filters; and wherein the at least one subband filter is selected from a group consisting of compression filters and encryption filters.

39. A computer program product for generating a set of jointly optimized linear signal processing filters and subband filters as set forth in claim 37, wherein one linear signal processing filter and one subband filter are optimized, and where the linear signal processing filter is a correlation filter and the subband filter is a compression filter, and where the correlation filter and the compression filter are optimized for object recognition for image data in image datasets.

40. A computer program product for generating a set of jointly optimized linear signal processing filters and subband filters as set forth in claim 39, wherein the compression filter is a quadrature mirror filter.

41. A computer program product for generating a set of jointly optimized linear signal processing filters and subband filters as set forth in claim 40, wherein the design scheme used for the correlation filter is a Lagrangian objective function for optimizing the correlation process by maximizing an in-class response and minimizing an out-of-class response, and where the design scheme used for the quadrature mirror filter is an iterative optimization procedure for optimizing a set of error terms comprising an amplitude distortion error term, an aliasing distortion error term, and a DC error term; whereby the correlation filter's ability to perform recognition is maximized and the quadrature mirror filter's ability to perform data compression is maximized without sacrificing the recognition ability of the correlation filter, thus optimizing quantization.

42. A computer program product for generating a set of jointly optimized linear signal processing filters and subband filters as set forth in claim 41, further comprising a means for optimizing the data compression of the quadrature mirror filter by employing an encoding optimizer.

43. A method for generating a set of jointly optimized linear signal processing filters and subband filters for processing digital data on a computer system, the method comprising the steps of:

determining a design scheme for at least one linear signal processing filter, with the design scheme for at least one linear signal processing filter dependent upon at least one performance characteristic;

determining a design scheme for at least one subband filter, with the design scheme for at least one subband filter dependent upon at least one performance characteristic;

relating the design scheme for the at least one linear signal processing filter and the design scheme for the at least one subband filter in order to determine a relationship therebetween; and jointly adjusting the design scheme for the at least one linear signal processing filter and the design scheme for the at least one subband filter using the relationship therebetween to optimize at least one desirable performance characteristic, where the performance characteristic to be optimized is content visualization; whereby a set of linear signal processing filters and subband filters are optimized together in order to provide better data processing performance with regard image compression/decompression than would be available without optimization.

* * * * *